(12) United States Patent
Lee et al.

(10) Patent No.: US 11,119,613 B1
(45) Date of Patent: Sep. 14, 2021

(54) TOUCH SENSING MODULE

(71) Applicant: Samsung Electro-Mechanics Co., Ltd., Suwon-si (KR)

(72) Inventors: Gye Won Lee, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/099,881

(22) Filed: Nov. 17, 2020

(30) Foreign Application Priority Data

Sep. 14, 2020 (KR) .......................... 10-2020-0117330

(51) Int. Cl.
*G06F 3/044* (2006.01)

(52) U.S. Cl.
CPC .... *G06F 3/044* (2013.01); *G06F 2203/04102* (2013.01)

(58) Field of Classification Search
CPC ....................... G06F 3/044; G06F 2203/04102
See application file for complete search history.

(56) References Cited

U.S. PATENT DOCUMENTS 10,551,659 B2 2/2020 Liu
2019/0278422 A1 9/2019 Franklin et al.

FOREIGN PATENT DOCUMENTS

KR 20210048498 A * 5/2021

* cited by examiner

*Primary Examiner* — Michael Pervan
(74) *Attorney, Agent, or Firm* — NSIP Law

(57) ABSTRACT

A touch sensing module is provided. The touch sensing module includes a flexible substrate including a coil portion including a plurality of layers and one or more coil patterns formed in at least one layer of the plurality of layers, and an extension portion that extends from the coil portion, and a sensing circuit, electrically connected to the coil pattern. The extension portion is configured to have a form in which at least one of the plurality of layers is extended.

14 Claims, 9 Drawing Sheets

TOUCH SENSING MODULE

CROSS-REFERENCE TO RELATED APPLICATION(S)

This application claims the benefit under 35 USC 119(a) of Korean Patent Application No. 10-2020-0117330 filed on Sep. 14, 2020, in the Korean Intellectual Property Office, the entire disclosure of which is incorporated herein by reference for all purposes.

BACKGROUND

1. Field

The following description relates to a touch sensing module.

2. Description of Related Art

Typically, a thinner, simpler, and neater form factor is preferred for wearable devices, and existing mechanical switches are accordingly not widely utilized. This has been accomplished by implementing dustproof and waterproof technologies, as well as the development of models which have a unified and smooth form factor.

Currently, techniques such as touch on metal (ToM) technology which involves touching a metal element, capacitor sensing technology that implements a touch panel, Micro-Electro-Mechanical-System (MEMS), micro strain gauge technology, and similar techniques are being developed. Additionally, a force-touch function has also been developed.

In the typical mechanical switch, a large size and internal space may be necessary to implement the switch function. Additionally, in structures in which a switch is not integrated with an external case, the mechanical switches may result in a structure that has an externally protruding design. Accordingly, a structure that has a mechanical switch may result in an obtrusive design, and may need a large inner space.

Additionally, there may be a risk of electric shock if direct contact is made with an electrically connected mechanical switch. Additionally, dust-proofing and water-proofing implementations may be difficult due to the structural deficiencies of mechanical switches.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a touch sensing module includes a flexible substrate comprising a coil portion including a plurality of layers, and one or more coil patterns formed in at least one layer of the plurality of layers, and an extension portion that extends from the coil portion; and a sensing circuit, electrically connected to the coil pattern, wherein the extension portion is configured to have a form in which at least one of the plurality of layers is extended.

The touch sensing module may further include a sensing coil disposed on an upper surface of the coil portion of the flexible substrate.

The sensing coil may further include a lower substrate; and a wound coil mounted on the lower substrate, and electrically connected to the sensing circuit.

The flexible substrate may further include a mounting portion that extends from the extension portion and has a flat mounting surface.

The touch sensing module may further include a sensing coil disposed on the mounting portion of the flexible substrate, wherein the sensing coil is electrically connected to the sensing circuit.

The touch sensing module may further include a pad, disposed on the mounting portion of the flexible substrate, and configured to sense a change in capacitance based on an external contact, wherein the pad is electrically connected to the coil pattern.

The touch sensing module may further include a sensing coil, disposed on an upper surface of the coil portion of the flexible substrate; and a pad, disposed on the mounting portion and configured to sense a change in capacitance based on an external contact, wherein the pad is electrically connected to the sensing coil.

The coil pattern may include a plurality of coil patterns separated from each other.

The coil portion may include a plurality of coil portions in each of which the coil pattern is disposed, and the flexible substrate may be deformed to be bent, and the plurality of coil portions are configured to overlap each other while being spaced apart from each other.

The coil pattern may be disposed in a first region of the coil portion, and the coil portion may be deformed to be bent, so that the first region in which the coil pattern is disposed may have a predetermined inclination with a second region of the coil portion.

The first region in which the coil pattern is disposed, and the second region of the coil portion, are perpendicular to each other, and at least one sensing coil may be disposed in the second region of the coil portion.

The coil portion may be configured to have an extended region that extends in a direction that is perpendicular to a direction in which the extension portion is formed, and may be configured to be deformed to be folded, so that the extended region has a predetermined inclination with respect to the second region of the coil portion.

Layers of the flexible substrate in which the coil pattern is disposed, and layers of the flexible substrate that form the extension portion may be the same the same layers.

At least some layers of the extension portion may include a connection conductor connected to the one or more coil patterns.

A coil pattern formed in a first of the plurality of layers may be configured to be electrically connected to a coil pattern formed in a second of the plurality of layers.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
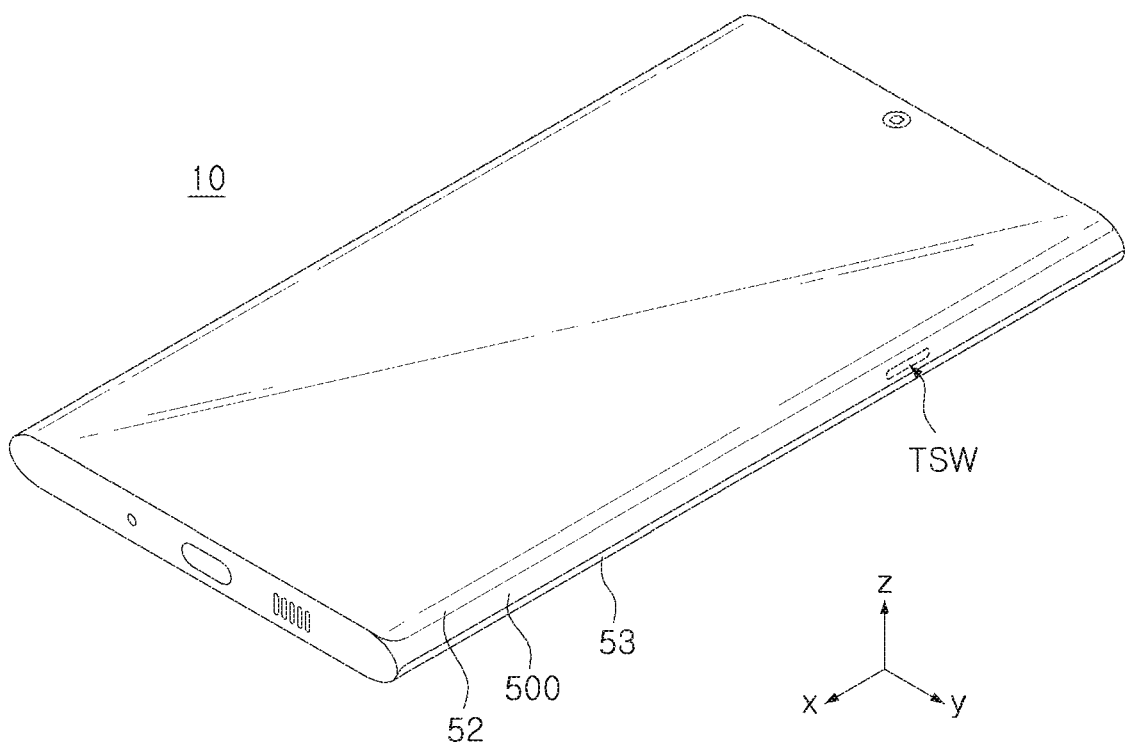
FIG. 1 is a perspective view of an example electronic device with a touch sensing module, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

FIG. 1 is an example perspective view of an example electronic device to which a touch sensing module, in accordance with one or more embodiments.

Referring to FIG. 1, an electronic device 10 may include a housing 500, a front display panel 52, a rear cover 53, and a touch switch unit TSW.

The housing 500 may cover at least a partial area of the electronic device 10, and at the same time, may be integrally formed with a structure that forms a central skeleton of the electronic device 10. In this example, the housing 500 may be formed of various materials based on the type and configuration of the electronic device 10. In an example, when the electronic device 10 corresponds to a smartphone as illustrated in FIG. 1, the housing 500 may be formed of a material of a metal frame. Additionally, in an example, the housing 500 may also be formed of a non-conductive material such as glass.

The front display panel 52 may be disposed on a first side of the housing 500, and the rear cover 53 may be disposed on a second side of the housing 500. In an example, the electronic device 10 may include a side surface having a two-layer to three-layer structure comprised of the front display panel 52, the housing 500, and the rear cover 53.

In an example, the touch switch unit TSW may be formed on a side surface of the electronic device 10 to replace a mechanical button. In this example, the touch switch unit TSW may correspond to a portion of the electronic device 10 to which a touch input is transmitted, for example, a contact surface to which pressure is applied by a user's hand. Further, referring to FIG. 1, the touch switch unit TSW may correspond to at least a partial area of the housing 500.

On the other hand, in FIG. 1, only an example in which one touch switch unit TSW is provided in the electronic device 10 is illustrated. However, in an example, a plurality of coils and pads may be included in a touch sensing module 50 (FIG. 2), a plurality of touch switch units TSW having different positions, angles and the like, may be provided.

In an example, when a coil is included for inductive sensing, the touch switch unit TSW may be provided in a portion of the housing 500 spaced apart from the coil by a predetermined distance. Additionally, when a pad is included for capacitive sensing, the touch switch unit TSW may be provided in a portion of the housing 500 in contact with the pad.

The electronic device 10 may be, as non-limiting examples, a portable device such as a smartphone, or may be a wearable device such as a smart watch, but is not limited to a specific device, but may be a portable or wearable electronic device, or may be an electronic device having a switching implementation for motion control.

In a non-limiting example, the electronic device 10 may be a smart phone, a personal digital assistant, a digital video camera, a digital still camera, a network system, a computer, a monitor, a tablet, a laptop, a netbook, a television, a video game, a smart watch, an automotive, etc., but is not limited thereto.

Hereinafter, for each of the figures, unnecessary redundant descriptions of components having the same reference numerals and the same functions may be omitted, and possible differences may be described for each drawing.

Figure 2:
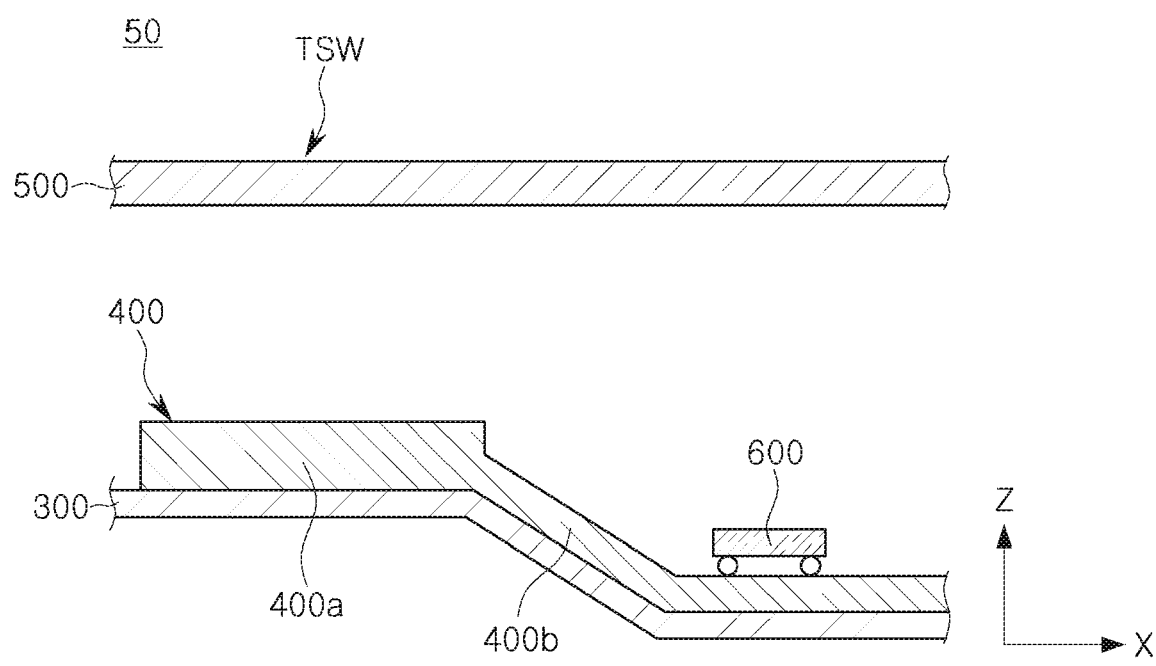
FIG. 2 illustrates a cross-sectional structure (in X-Z directions) of an example touch sensing module, in accordance with one or more embodiments.
Figure 3:
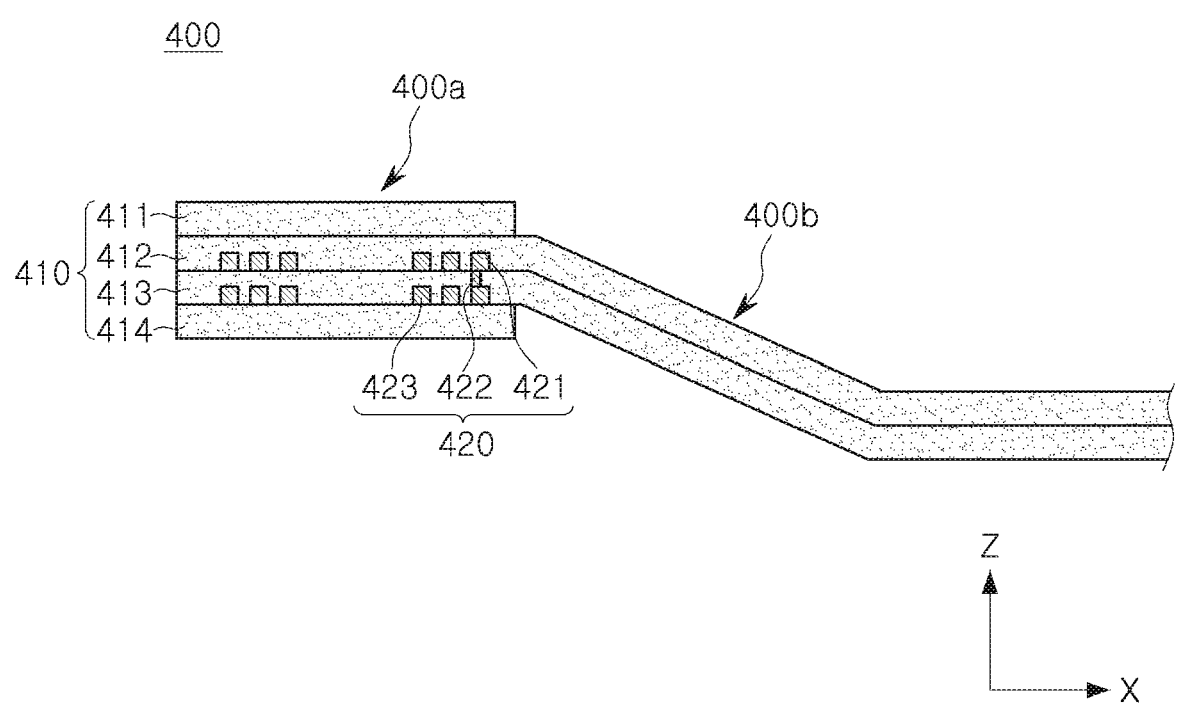
FIG. 3 illustrates a cross-sectional structure (in X-Z directions) of an example flexible substrate of FIG. 2.

FIG. 2 is a cross-sectional view illustrating a cross-sectional structure (in X-Z directions) of a touch sensing module, in accordance with one or more embodiments, and FIG. 3 is a view illustrating a cross-sectional structure (in X-Z directions) of a flexible substrate of FIG. 2.

Referring to FIG. 2, the basic concept of the examples is to sense the degree of inward bending of the housing 500 when pressure is applied to the touch switch unit TSW, so that touches may be input to the side surface of the electronic device 10 without a physical button.

As illustrated in FIG. 2, the touch sensing module 50, according to an example, may be inserted and disposed in an inside of the housing 500. In this example, the touch sensing module 50 may be disposed to be spaced apart from the inner surface of the housing 500 by a predetermined distance, but the arrangement manner thereof is not necessarily limited thereto, and in an example in which capacitive sensing is performed by the touch sensing module 50, the inner surface of the housing 500 and the pad may be disposed to contact each other.

In this example, the touch sensing module 50 is a device that detects a touch input. In the examples, the touch or touch application is a concept including a contact touch that is in contact without a force and including a force touch that involves a surface to be touched with a force (pressure).

Accordingly, the touch sensing module 50 according to various examples may perform inductive sensing by force touch or capacitive sensing by contact touch, depending on components included in respective examples, and may also perform hybrid sensing in which both are used at the same time.

Referring to FIGS. 2 and 3 together, the touch sensing module 50 according to an example includes a bracket 300, a flexible substrate 400, and a sensing circuit 600. The bracket 300 may be excluded or replaced by other devices depending on an example.

The bracket 300 may support the flexible substrate 400, in such a manner that a predetermined distance between the housing 500 and the flexible substrate 400 is maintained. In an example, when the user does not apply pressure to the housing 500, the distance between a coil pattern 420 included in the flexible substrate 400 and the housing 500 may be maintained by a predetermined distance by the bracket 300.

In this example, the bracket 300 may be formed of a conductor such as metal, but is not limited to metal. The bracket 300 may be attached to an internal structure of the electronic device 10 to which the touch sensing module 50 is applied, or may be supported using a separate support member. The bracket 300 may have a structure that supports the flexible substrate 400 and maintains a predetermined distance between the plurality of coils and the housing 500, and the structure of the bracket 300 is not limited to a special structure.

The touch sensing module 50 includes the flexible substrate 400 disposed to be spaced apart from an inner side of the housing 500. In this example, the flexible substrate 400 refers to an FPCB, and thus, may be deformed in a manner of bending or folding a portion of the flexible substrate 400 as required.

Referring to FIGS. 2 and 3, the flexible substrate 400 according to an example includes a coil portion 400a and an extension portion 400b.

The coil portion 400a may include a plurality of layers 410, and may include the coil pattern 420 formed in at least one of the plurality of layers 410. In an example, as illustrated in FIG. 3, the coil pattern 420 may only be formed in second and third layers 412 and 413 among first to fourth layers 411, 412, 413 and 414.

The extension portion 400b extends from the coil portion 400a, and may have a form in which portions of the plurality of layers 410 included in the coil portion 400a extend. As an example, as illustrated in FIG. 3, the second and third layers 412 and 413 among the first to fourth layers 411, 412, 413 and 414 may be extended to form the extension portion 400b.

In this example, the layer in which the coil pattern 420 is formed and the layer in which the extension portion 400b is formed may be the same. For example, as illustrated in FIG. 3, the coil patterns 420 are formed in the second and third layers 412 and 413 among the first to fourth layers 411, 412, 413 and 414, and may also extend to form the extension portions 400b.

Alternatively, the layer in which the coil pattern 420 is formed and the layer in which the extension portion 400b is formed may be different from each other. In an example, although not illustrated in the drawing, while the coil pattern 420 is formed in the second and third layers 412 and 413 among the first to fourth layers 411, 412, 413 and 414, the third and fourth layers 413 and 414 may be extended to form the extension portions 400b.

On the other hand, in the examples, only the example in which the plurality of layers 410 constituting the coil portion 400a and the flexible substrate 400 are four layers is described, but the number of the layers included in the plurality of layers 410 may be variously changed. Additionally, among the plurality of layers 410, the number of layers in which the coil pattern 420 is formed and the number of layers in which the extension portion 400b is formed may also be variously changed. In an example, the plurality of layers 410 constituting the coil portion 400a of the flexible substrate 400 may include eight layers. Among the eight layers, the coil pattern 420 may be formed in, as an example, four layers, and the extension portion 400b may be formed in the other four layers. However, this is only an example, and the extension portion 400b may be formed in less than four layers.

The coil pattern 420 having conductivity is formed in the coil portion 400a. In this example, the plurality of layers 410 included in the flexible substrate 400 may be formed of an insulating material, and the coil pattern 420 may be formed of a conductive material. In an example, the coil pattern 420 may include a material such as, but not limited to, silver, copper, nickel, platinum, tin, gold, or the like.

The coil pattern 420 may include at least one pattern portion, and in the example of including a plurality of pattern portions, the coil pattern 420 may further include a via portion. In an example in which the coil pattern 420 is formed in the second and third layers 412 and 413 as illustrated in FIG. 3, the coil pattern 420 may include a first pattern portion 421, a via part 422, and a second pattern portion 423. In this example, the first and second pattern portions 421 and 423 and the via portion 422 may be formed of the same conductive material.

The first and second pattern portions 421 and 423 may be implemented in the form of a coil in the layers 412 and 413, respectively, and specific shapes thereof may be variously changed. In an example, the first and second pattern portions 421 and 423 may be implemented in a coil shape having any one of a circular shape, a quadrangular shape, and a track shape. The via portion 422 may be provided between the first and second pattern portions 421 and 423, such that the first pattern portion 421 formed in the second layer 412 and the second pattern portion 423 formed in the third layer 413 may be electrically connected to each other to form one coil.

The extension portion 400b may have a shape in which some of the layers 410 included in the coil portion 400a are extended. In this example, the extension portion 400b may be included in the flexible substrate 400, and thus, may be bent or folded in various forms as needed. In an example, the extension portion 400b may be deformed to be bent further downwardly than the coil portion 400a to be used as illustrated in FIG. 3. As the flexible substrate 400 is used for the extension portion 400b as described above, the components of the touch sensing module 50 may be disposed by more freely utilizing the internal space of the electronic device 10.

Referring to FIG. 2, the touch sensing module 50 according to an example may include the sensing circuit 600.

When a change in inductance or capacitance occurs in the coil or pad, the sensing circuit 600 may detect the change in inductance or capacitance, and generate a touch input signal. At this time, the sensing circuit 600 is electrically connected to the coil or the pad, to sense the change.

The sensing circuit 600 according to an example may be electrically connected to the coil pattern 420. When a change in inductance occurs in the coil pattern 420 of the flexible substrate 400 as a touch is applied, a touch input signal may be generated therefrom.

In detail, as the pressure due to the touch is applied to the touch switch unit TSW, the housing 500 is pushed downwardly to become closer to the flexible substrate 400. Then, the separation distance between the coil pattern 420 formed on the flexible substrate 400 and the housing 500 decreases, thereby causing a change in the inductance of the coil pattern 420.

The sensing circuit 600 may include a resonance circuit, and the resonance circuit may generate a resonance signal from a change in inductance occurring in the coil pattern 420. At this time, the resonant frequency of the resonance signal also changes according to the change in inductance, and the sensing circuit 600 may determine a force value (a pressure level) of the applied touch, based on the change amount of the resonant frequency. In an example, the sensing circuit 600 may determine whether the force value of the applied touch exceeds a threshold value to generate a touch input signal. In an example in which a force touch exceeding the threshold value is applied as a result of the determination, the sensing circuit 600 may determine that a normal touch input is applied and may generate a touch input signal.

Figure 4:
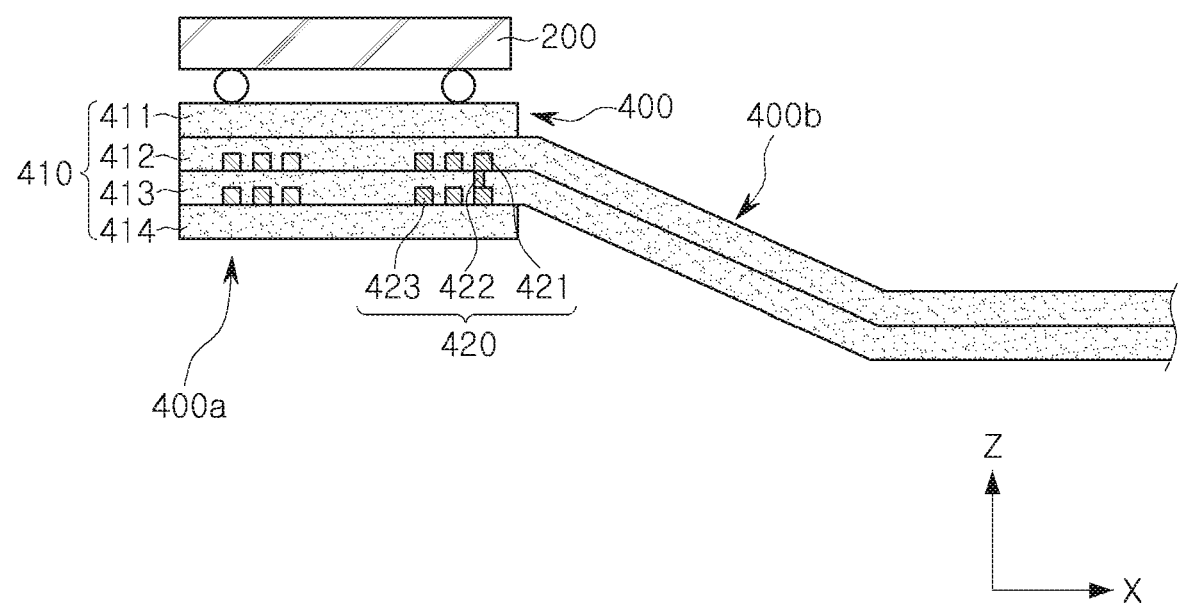
FIG. 4 illustrates a cross-sectional structure (in X-Z directions) of an example in which a sensing coil is mounted on the flexible substrate of FIG. 2.

FIG. 4 illustrates a cross-sectional structure (in X-Z directions) of an example in which a sensing coil is mounted on the flexible substrate of FIG. 2.

As illustrated in FIG. 4, according to another example, a sensing coil 200 may be added to the flexible substrate 400 illustrated in FIG. 3. For example, the sensing coil 200 may be disposed on an upper surface of the coil portion 400a of the flexible substrate 400.

Figure 6A:
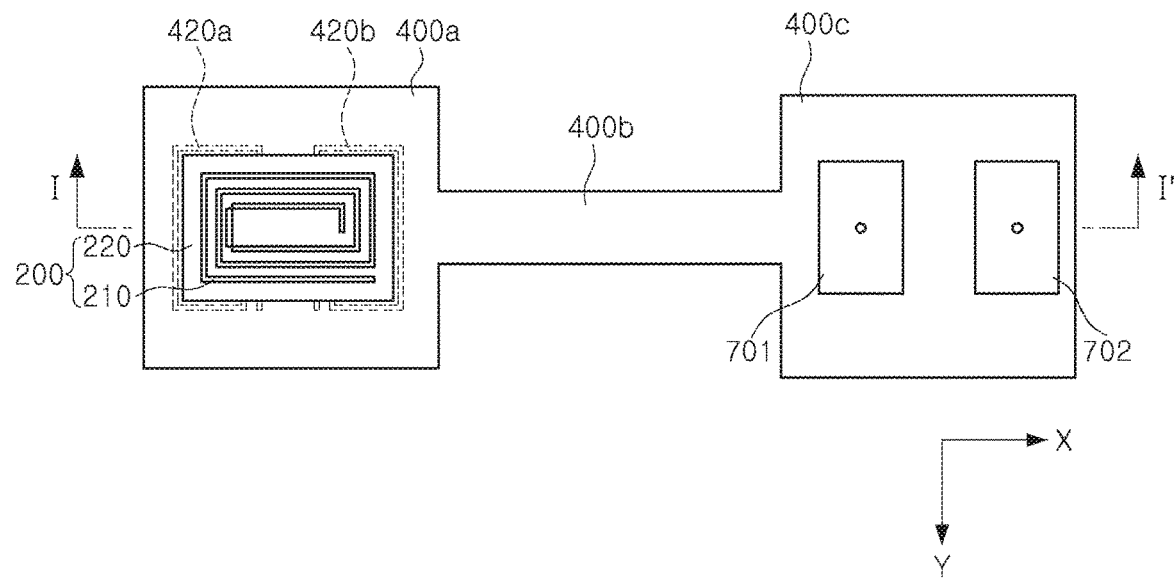
FIG. 6A illustrates a front view of a flexible substrate according to an example.

Referring to FIG. 6A, the sensing coil 200 may include a lower substrate 220 and a wound coil 210 mounted on the lower substrate 220, as will be described later. In this example, the wound coil 210 is electrically connected to the sensing circuit 600, such that a change in inductance occurring in the wound coil 210 may be transmitted to the sensing circuit 600. In an example, similar to the above-described coil pattern 420, as a touch is applied, an inductance change occurs in the sensing coil 200, and the sensing circuit 600 may generate a touch input signal therefrom.

In this example, the wound coil 210 included in the sensing coil 200 may be formed of a conductive material, and may include a material, for example, such as silver, copper, nickel, platinum, tin, gold, or the like. Additionally, the lower substrate 220 may correspond to an FPCB, but is not limited thereto. In an example, as the lower substrate 220, various types of substrates having a structure in which at least one metal layer and at least one wiring layer are alternately stacked may all be implemented, in addition to the FPCB. The wound coil 210 may be mounted on the lower substrate 220 in a manner such as SMT or the like.

On the other hand, according to the example illustrated in FIG. 4, since the sensing coil 200 is disposed on the upper surface of the coil portion 400a of the flexible substrate 400, the coil pattern 420 and the sensing coil 200 may be disposed to overlap in a vertical direction. Additionally, the housing 500, which may be formed of a material such as a metal or the like, may be spaced apart from the sensing coil 200 by a predetermined distance.

According to this example, when pressure is applied to the touch switch unit TSW of the housing 500, the separation distance between the sensing coil 200 and the housing 500, and the separation distance between the coil pattern 420 and the housing 500 may be reduced simultaneously. Then, a change in inductance occurs in the sensing coil 200, and a change in inductance also occurs in the coil pattern 420.

In this example, the sensing coil 200 and the coil pattern 420 may be connected to one common sensing circuit 600, and a change amount of respective inductances may be summed. Accordingly, even when the user applies a relatively small amount of pressure, a large change may be sensed by the summed amount of change in inductance, and thus, the sensing sensitivity of the touch sensing module 50 may be improved.

Figure 5A:
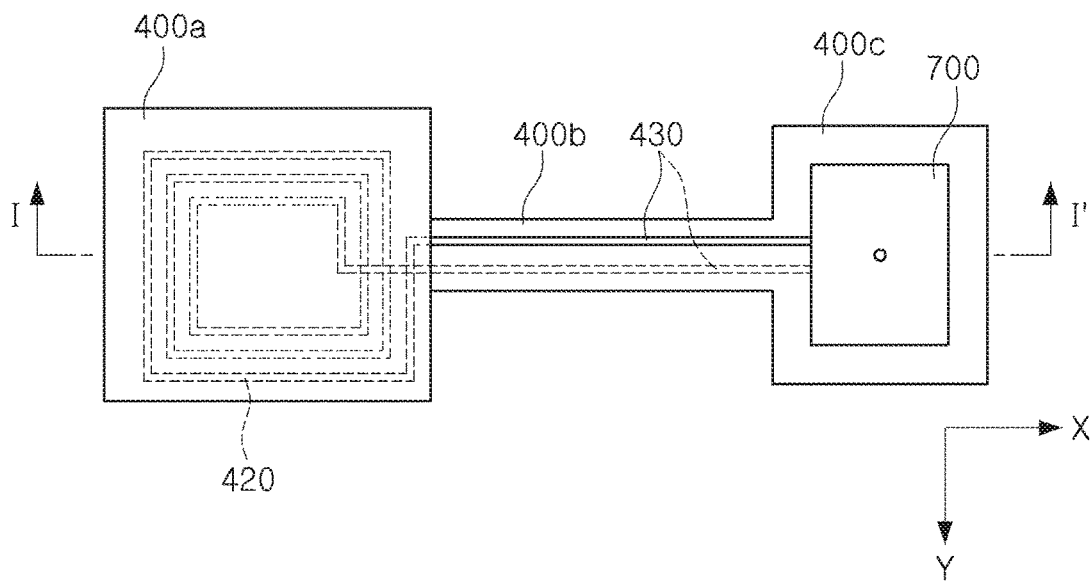
FIGS. 5A and 5B illustrate a front view of an example in which a pad is mounted on the flexible substrate of FIG. 2 and a cross-sectional view in the direction of I-I' in FIG. 5A, respectively.
Figure 5B:
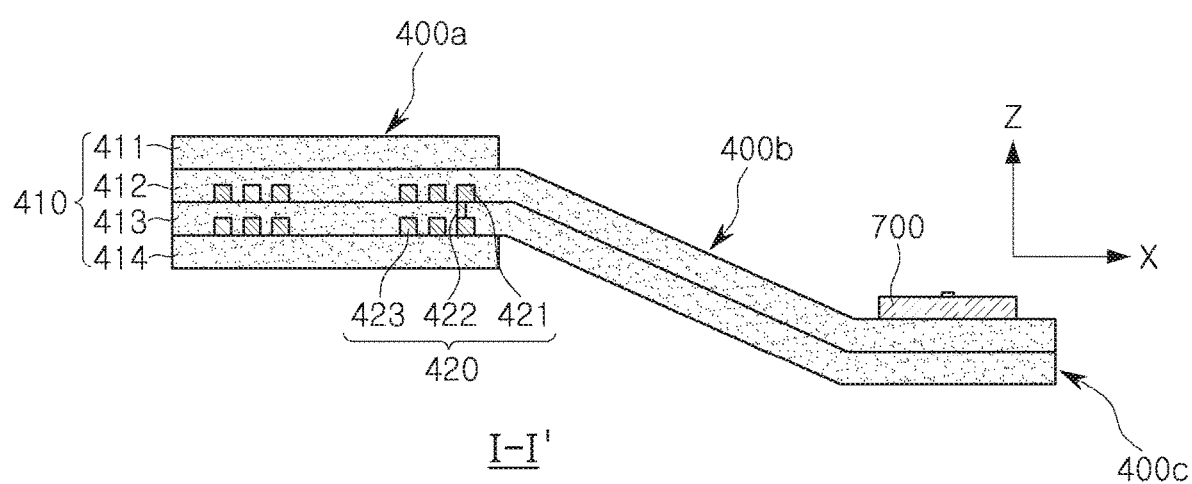

FIGS. 5A and 5B illustrate a front view of an example in which a pad is mounted on the flexible substrate of FIG. 2 and a cross-sectional view in the direction of I-I' in FIG. 5A, respectively.

As illustrated in FIGS. 5A and 5B, according to another example, a pad 700 may be added to the flexible substrate 400 as illustrated in FIG. 3. The pad 700 may detect a change in capacitance by external contact.

In this example, the pad 700 may refer to various devices used to sense a user's contact touch. Accordingly, components constituting the pad 700 and internal structures thereof may also vary. In an example, electrodes having different polarities may be provided on the pad 700, and each electrode may be electrically connected to the coil pattern 420, the sensing coil 200, the sensing circuit 600, and the like.

According to the example illustrated in FIGS. 5A and 5B, a touch switch unit of the housing 500 may be provided on the upper side of the pad 700. When a touch is applied by the user's hand to the touch switch unit, a change in capacitance may be sensed by the pad 700. In this example, since the sensing circuit 600 includes the coil pattern 420 or the sensing coil 200, the pad 700 and the coil may form a resonance circuit together. In an example, as illustrated in FIG. 5A and FIG. 5B, the coil pattern 420 and the pad 700 may be electrically connected to each other to form one resonance circuit.

In more detail, as a contact touch by a user's hand is applied to the touch switch unit, a change occurs in a medium to be contacted, thereby causing a change in capacitance sensed by the pad 700. In this example, the resonance circuit including the coil pattern 420 and the pad 700 may generate a resonance signal from a change in capacitance sensed by the pad 700.

The resonant frequency of the resonant signal is also changed according to the change in capacitance, and the sensing circuit 600 may determine whether the applied contact touch is caused by the user's hand based on the amount of change in the resonant frequency. As a result of the determination, in the example in which a contact by the user's hand is applied, the sensing circuit 600 may determine that a normal touch input is applied, and based thereon, a touch input signal may be generated by a contact touch.

On the other hand, as illustrated in FIGS. 5A and 5B, the flexible substrate 400 may further include a mounting portion 400c. In this example, the mounting portion 400c refers to a portion that extends from the extension portion 400b, and having a flat mounting surface.

In a non-limiting example, the mounting portion 400c may be configured with only the same layer as the extension portion 400b, or may be configured by further including one or more layers in the extension portion 400b. Additionally, various components such as the sensing coil 200, the pad 700 and the like may be mounted on the mounting portion 400c by a method such as SMT.

Referring to FIGS. 5A and 5B, the pad 700 may be disposed on the mounting portion 400c of the flexible substrate 400. In this example, the pad 700 may be electrically connected to the sensing circuit 600 as described above, and may also be electrically connected to the coil pattern 420 as illustrated in FIG. 5A.

Referring to FIG. 5A, a connection conductor 430 may be provided between the pad 700 and the coil pattern 420, and thus, may electrically connect the pad 700 and the coil pattern 420 to each other. The connection conductor 430 may be formed of a conductive material, and may include, as non-limiting examples, a material such as silver, copper, nickel, platinum, tin, gold, or the like. In this example, the connection conductor 430 may be formed in at least some layers of the extension portion 400b to connect a component disposed in the coil portion 400a and a component disposed in the mounting portion 400c to each other.

Figure 6B:
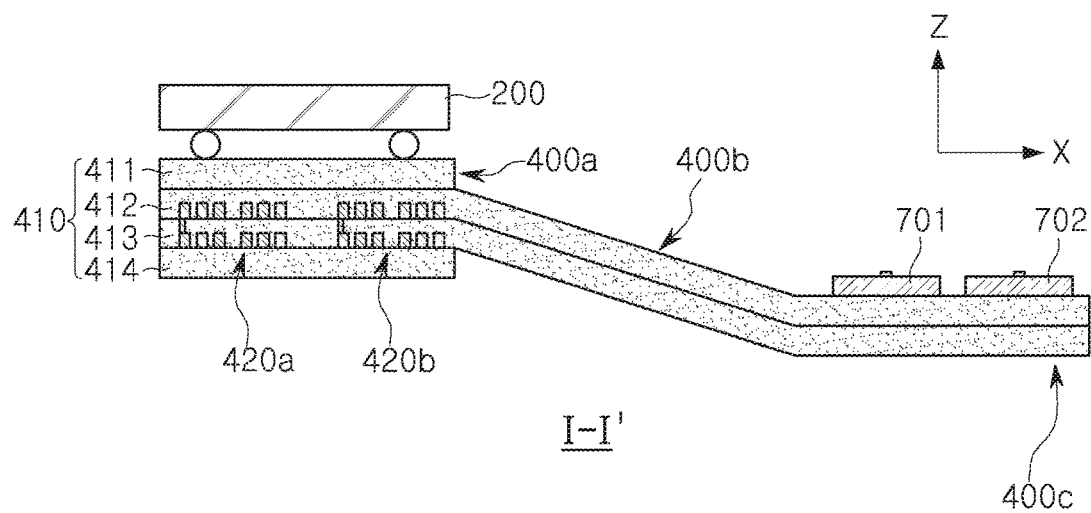
FIG. 6B is a cross-sectional view taken along line I-I' of FIG. 6A, respectively.
Figure 7:
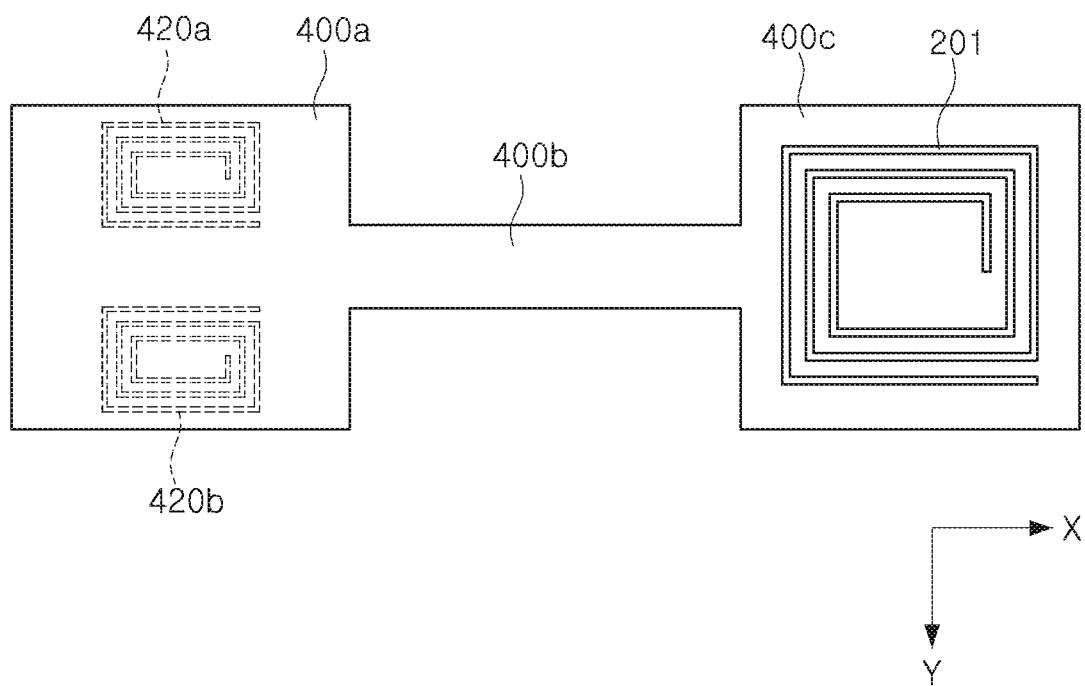
FIG. 7 illustrates a front view of a flexible substrate, in accordance with one or more embodiments.

FIGS. 6A, 6B, and 7 illustrate various examples implementing the coil pattern 420, the sensing coil 200, and the pad 700 described above. In an example, in view of factors such as the internal structure of the electronic device 10 and the number and positional relationship of the touch switch units, the coil pattern 420, the sensing coil 200, and the pad 700 may be additionally disposed freely on the flexible substrate 400 according to an example as necessary.

FIGS. 6A and 6B provide a front view and a cross-sectional view of a flexible substrate according to another example in the I-I' direction, respectively, and FIG. 7 is a front view of a flexible substrate according to another example.

First, referring to FIGS. 6A and 6B, the coil pattern 420 formed in the coil portion 400a of the flexible substrate 400 may include a plurality of coil patterns 420a and 420b formed separately from each other. In an example, one coil pattern 420 may be formed in the coil portion 400a, or two or more coil patterns 420a and 420b may also be formed together therein.

In this example, the plurality of coil patterns 420a and 420b may be connected to different sensing circuits 600 to be implemented as separate sensors, or connected to one common sensing circuit 600 so that the amount of change in inductance may be summed, to function as a sensor having improved sensing sensitivity. Additionally, the plurality of coil patterns 420a and 420b may be connected to one common sensing circuit 600, but may function as a sensor that may discriminate a touch input due to a malfunction by comparing the amounts of change in inductance generated in the coil patterns 420a and 420b.

On the other hand, as illustrated in FIGS. 6A and 6B, a plurality of pads 701 and 702 may be disposed on the mounting portion 400c of the flexible substrate 400. The plurality of coil patterns 420a and 420b may be electrically connected to the pads 701 and 702, respectively. In this example, a touch switch unit of the housing 500 may be provided on upper sides of the plurality of pads 701 and 702, respectively.

When a touch is applied to the touch switch unit by the user's hand, a change in capacitance may be sensed in each of the pads 701 and 702. In this example, the pads 701 and 702 that are electrically connected to the coil patterns 420a and 420b, respectively, may form separate resonance circuits.

Additionally, resonance circuits may be connected to different sensing circuits 600 to function as separate sensors, or may be connected to one common sensing circuit 600 to add up the amounts of change in capacitance, to function as a sensor having improved sensing sensitivity. Additionally, resonance circuits may be connected to one common sensing circuit 600, and by comparing the amounts of change in capacitance sensed by the pads 701 and 702, to function as the sensor that discriminates a touch input due to a malfunction.

Additionally, as illustrated in FIGS. 6A and 6B, a sensing coil 200 may be further provided on the upper surface of the coil portion 400*a*. Additionally, the housing 500 may be disposed to be spaced apart from the sensing coil 200, and a touch switch unit may be provided in an upper region of the sensing coil 200. In this example, the plurality of pads 701 and 702 and the coil patterns 420*a* and 420*b* described above may be implemented as two sensors that perform capacitive sensing, respectively, and the sensing coil 200 may be implemented as one sensor that performs inductive sensing.

However, the above-described examples are merely examples, and according to various electrical connection relationships between the coil pattern 420, the sensing coil 200, and the pad 700 included in the flexible substrate 400, various touch sensing modules having different numbers and arrangements of sensors performing capacitive sensing and inductive sensing may be implemented.

Referring to FIG. 7, not only the pad 700 but also the sensing coil 200 may be disposed on the mounting portion 400*c* of the flexible substrate 400. Additionally, the sensing coil 200 disposed on the mounting portion 400*c* may be electrically connected to the sensing circuit 600.

More specifically, the flexible substrate 400 may include a coil pattern 420 formed in the coil portion 400*a* and the sensing coil 200 disposed on the mounting portion 400*c*. For example, as illustrated in FIG. 7, first and second coil patterns 420*a* and 420*b* may be formed together in the coil portion 400*a*, and one sensing coil 200 may be mounted on the mounting portion 400*c*.

In this example, the housing 500 is disposed to be spaced apart from the flexible substrate 400, and separate touch switch units may be provided in the upper region of the coil portion 400*a* and the upper region of the mounting portion 400*c* in the housing 500, respectively. Then, the first and second coil patterns 420*a* and 420*b* may each exhibit a change in inductance as a pressure is applied to the touch switch unit provided in the upper region of the coil portion 400*a*. Additionally, the sensing coil 200 may each exhibit a change in inductance as pressure is applied to a touch switch unit provided in an upper region of the mounting portion 400*c*.

In this example, the plurality of coil patterns 420*a* and 420*b* and the sensing coil 200 may be connected to a different sensing circuit 600, respectively, to function as separate sensors, or may be connected to one common sensing circuit 600 in such a manner that the amounts of change in inductance generated in the plurality of coil patterns 420*a* and 420*b* and the sensing coil 200 may be compared to each other, to function as a sensor that discriminates a touch input due to a malfunction.

Since the flexible substrate 400 according to an example may be bent or may be folded, the flexible substrate 400 may be appropriately deformed depending on the internal structure of the electronic device 10 to efficiently utilize a limited space.

Figure 8A:
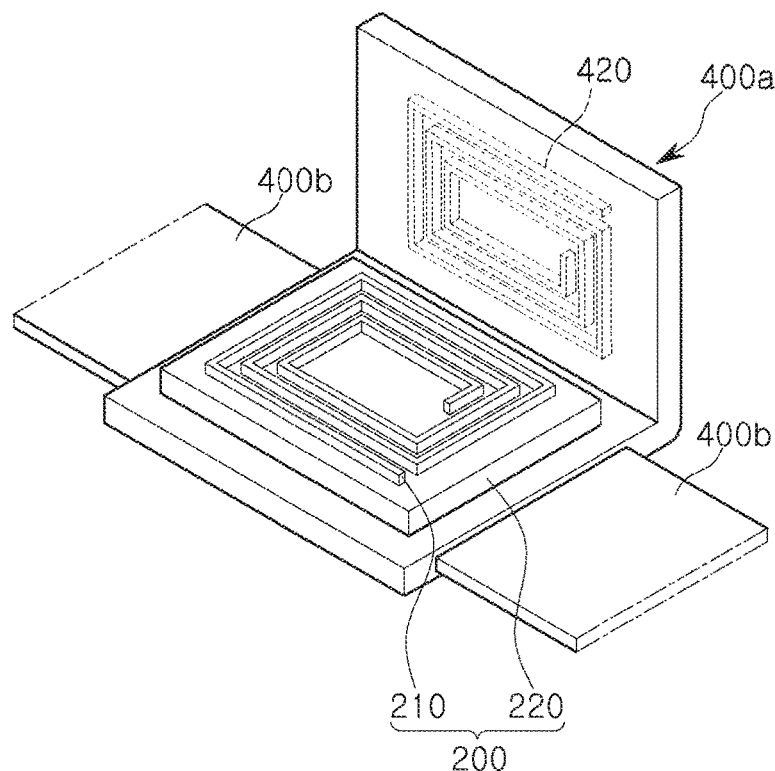
FIGS. 8A and 8B illustrate perspective views of flexible substrates, in accordance with one or more embodiments, respectively.
Figure 8B:
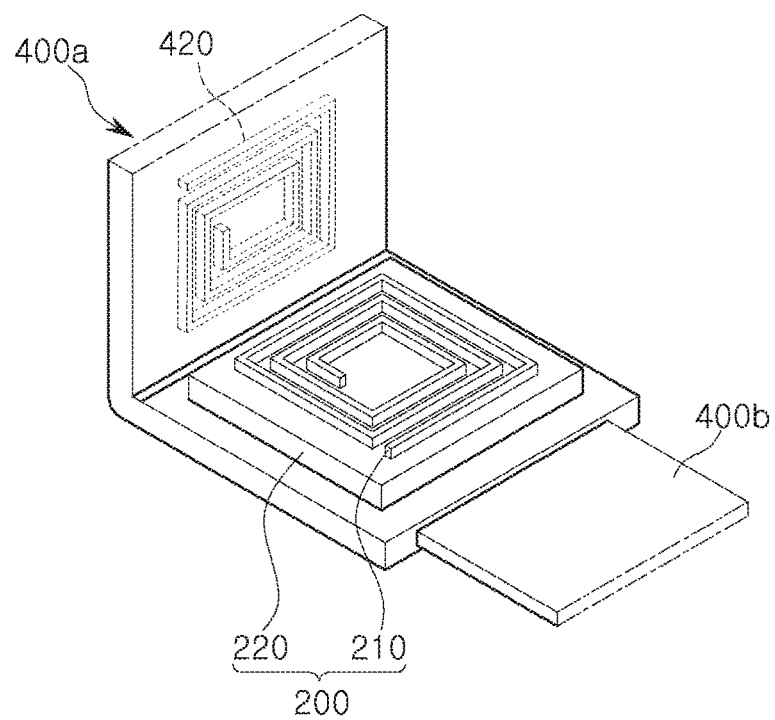
Figure 9A:
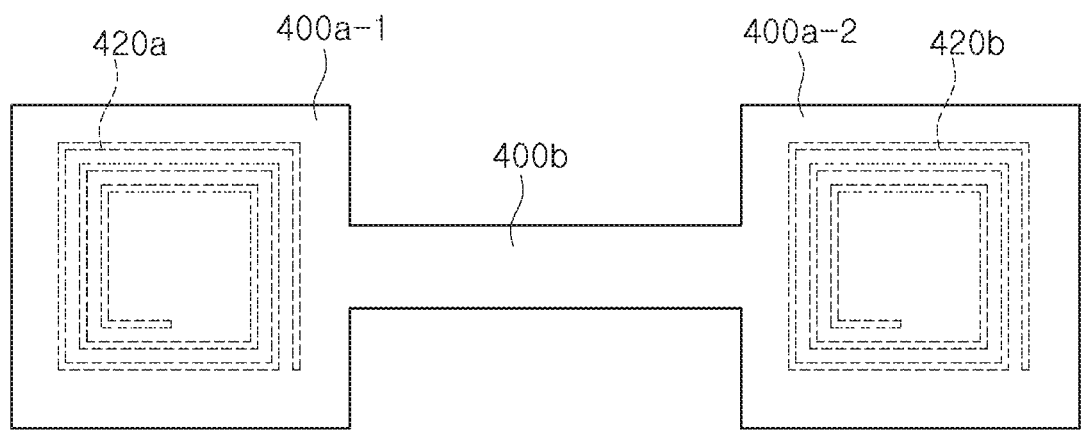
FIG. 9A illustrates a front view before deformation of a flexible substrate and FIG. 9B illustrates a perspective view after deformation of the flexible substrate, in accordance with one or more embodiments.
Figure 9B:
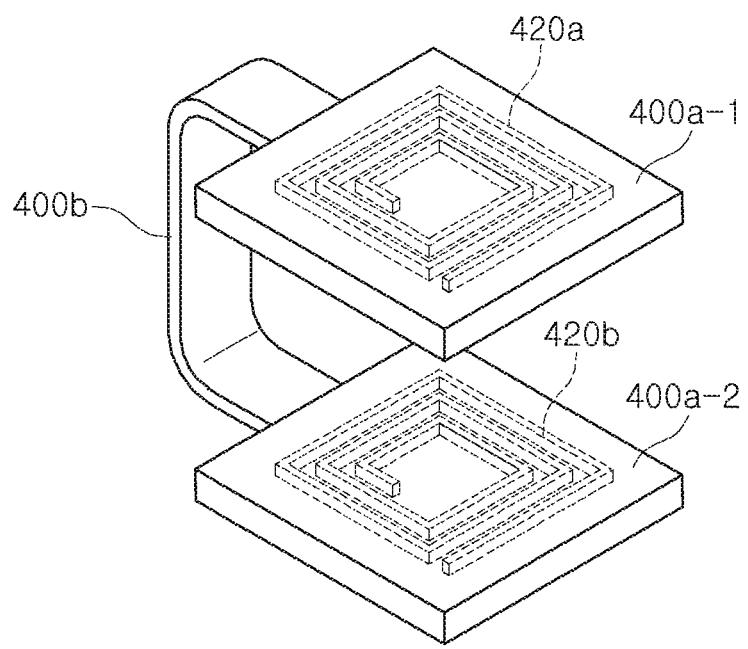

FIGS. 8A and 8B illustrate perspective views of flexible substrates according to first and second modified examples of the present disclosure, respectively, FIG. 9A is a front view before deformation, and FIG. 9B is a perspective view after deformation of the flexible substrate according to a third modified example of the present disclosure.

First, according to the first and second modified examples illustrated in FIGS. 8A and 8B, the flexible substrate 400 may be deformed into a folded shape such that a portion of the coil portion 400*a* has a predetermined inclination. In this example, the coil pattern 420 may be formed in one region of the coil portion 400*a*, and the coil portion 400*a* may be folded and deformed, in such a manner that one region in which the coil pattern 420 is formed has a predetermined inclination with the other region of the coil portion 400*a*.

According to the first modified example, the coil portion 400*a* may have a region further extending in a direction perpendicular to the direction in which the extension portion 400*b* is formed. Additionally, the coil portion 400*a* may be folded and deformed, such that the further extended region may have a predetermined inclination with the other region of the coil portion 400*a*. For example, as illustrated in FIG. 8A, the coil portion 400*a* may be characterized in that it is folded and deformed, in such a manner that the further extended region of the coil portion 400*a* may have a predetermined inclination with respect to the other region of the coil portion 400*a*.

Additionally, according to the second modified example, the coil portion 400*a* may have a region further extending in a direction opposite to the direction in which the extension unit 400*b* is formed. Additionally, the coil portion 400 may be folded and deformed such that the further extended region may have a predetermined inclination with the other region of the coil portion 400*a*. In an example, as illustrated in FIG. 8B, the coil portion 400*a* may be folded and deformed in such a manner that a first extended region of the coil portion 400*a* is perpendicular to a second region of the coil portion 400*a*.

Additionally, in this example, as illustrated in FIGS. 8A and 8B, a sensing coil 200 may be additionally disposed in an area that is not vertically folded in the coil portion 400*a*. In the first and second modified examples, separate touch switch units may be implemented in positions perpendicular to each other, or may be utilized to determine malfunctions that may be applied in a direction perpendicular to one touch switch unit. Additionally, depending on the internal space of the electronic device 10, the first and second modified examples may be appropriately mixed and utilized.

According to the third modified example illustrated in FIGS. 9A and 9B, the flexible substrate 400 may be transformed into a shape in which an extension portion 400*b* of the flexible substrate 400 is bent.

First, referring to FIG. 9A, the coil portion 400*a* may include a plurality of coil portions 400*a*-1 and 400*a*-2 on which respective coil patterns 420*a* and 420*b* are formed. Additionally, the extension portion 400*b* may be formed between the plurality of coil portions 400*a*-1 and 400*a*-2.

In this example, as illustrated in FIG. 9B, the flexible substrate 400 according to the third modified example may be bent and deformed in such a manner that the plurality of coil portions 400*a*-1 and 400*a*-2 are spaced apart from each other and overlap. For example, the first coil portion 400*a*-1 on which the first coil pattern 420*a* is formed may be disposed on the upper side, and the second coil portion 400*a*-2 on which the second coil pattern 420*b* is formed may be disposed on the lower side. Additionally, in this example, a plurality of coil patterns 420*a* and 420*b* disposed on the upper and lower portions may overlap each other, and a housing 500 formed of a material such as metal or the like may be spaced apart from the first coil pattern 420*a* by a predetermined distance.

According to this third modified example, when pressure is applied to the touch switch unit TSW of the housing 500, a separation distance between the first coil pattern 420*a* and the housing 500, and a separation distance between the second coil pattern 420*b* and the housing 500 may be simultaneously reduced. Then, a change in inductance may occur simultaneously in the plurality of coil patterns 420*a* and 420*b*.

In this example, the plurality of coil patterns 420*a* and 420*b* may be connected to one common sensing circuit 600, and amounts of change in inductance may be summed. Accordingly, even in the example in which the user applies a relatively small amount of pressure, a large change may be sensed by the summed amount of change in inductance, so that the sensing sensitivity of the touch sensing module 50 may be improved. Additionally, in the example in which the internal space of the electronic device 10 is limited, a sensor including a plurality of coils may be implemented in a narrow space.

As set forth above, in a touch sensing module according to an example, a plurality of coils may be disposed in a limited space and may be utilized. Further, the plurality of coils may respectively sense touch inputs acting at different positions, angles, and the like.

Additionally, the touch sensing module according to an example may enable inductive sensing and capacitive sensing to be simultaneously performed as a user applies a touch.

Additionally, the touch sensing module according to an example may improve stability by increasing the flatness of a structure including a coil, and material costs may be further reduced.

Additionally, in the touch sensing module according to an example, force sensing sensitivity to an applied pressure may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing module comprising:
    a flexible substrate comprising a coil portion including a plurality of layers, and one or more coil patterns formed in at least one layer of the plurality of layers, and an extension portion that extends from the coil portion; and
    a sensing circuit, electrically connected to the coil pattern,
    wherein the extension portion is configured to have a form in which at least one of the plurality of layers is extended.

2. The touch sensing module of claim 1, further comprising a sensing coil disposed on an upper surface of the coil portion of the flexible substrate.

3. The touch sensing module of claim 2, wherein the sensing coil comprises:
    a lower substrate; and
    a wound coil mounted on the lower substrate, and electrically connected to the sensing circuit.

4. The touch sensing module of claim 1, wherein the flexible substrate further comprises a mounting portion that extends from the extension portion and has a flat mounting surface.

5. The touch sensing module of claim 4, further comprising a sensing coil disposed on the mounting portion of the flexible substrate,
    wherein the sensing coil is electrically connected to the sensing circuit.

6. The touch sensing module of claim 4, further comprising a pad, disposed on the mounting portion of the flexible substrate, and configured to sense a change in capacitance based on an external contact,
    wherein the pad is electrically connected to the coil pattern.

7. The touch sensing module of claim 4, further comprising:
    a sensing coil, disposed on an upper surface of the coil portion of the flexible substrate; and
    a pad, disposed on the mounting portion and configured to sense a change in capacitance based on an external contact,
    wherein the pad is electrically connected to the sensing coil.

8. The touch sensing module of claim 1, wherein the coil pattern comprises a plurality of coil patterns separated from each other.

9. The touch sensing module of claim 1, wherein the coil portion comprises a plurality of coil portions in each of which the coil pattern is disposed, and
    the flexible substrate is deformed to be bent, and the plurality of coil portions are configured to overlap each other while being spaced apart from each other.

10. The touch sensing module of claim 1, wherein the coil pattern is disposed in a first region of the coil portion, and
    the coil portion is deformed to be bent, so that the first region in which the coil pattern is disposed has a predetermined inclination with a second region of the coil portion.

11. The touch sensing module of claim 10, wherein the first region in which the coil pattern is disposed, and the second region of the coil portion, are perpendicular to each other, and at least one sensing coil is disposed in the second region of the coil portion.

12. The touch sensing module of claim 1, wherein the coil portion is configured to have an extended region that extends in a direction that is perpendicular to a direction in which the extension portion is formed, and is configured to be deformed to be folded, so that the extended region has a predetermined inclination with respect to the second region of the coil portion.

13. The touch sensing module of claim 1, wherein layers of the flexible substrate in which the coil pattern is disposed, and layers of the flexible substrate that form the extension portion are the same the same layers.

14. The touch sensing module of claim 1, wherein at least some layers of the extension portion include a connection conductor connected to the one or more coil patterns.

* * * * *